United States Patent
Wright

(10) Patent No.: US 7,608,984 B2
(45) Date of Patent: Oct. 27, 2009

(54) MOTION AMPLIFICATION USING PIEZOELECTRIC ELEMENT

(75) Inventor: David D. Wright, Vershire, VT (US)

(73) Assignee: Adaptivenergy, LLC, Hampton, VA (US)

(*) Notice: Subject to any disclaimer, the term of this patent is extended or adjusted under 35 U.S.C. 154(b) by 0 days.

(21) Appl. No.: 11/747,469

(22) Filed: May 11, 2007

(65) Prior Publication Data

US 2007/0273248 A1   Nov. 29, 2007

Related U.S. Application Data

(60) Provisional application No. 60/747,286, filed on May 15, 2006, provisional application No. 60/747,287, filed on May 15, 2006, provisional application No. 60/747,289, filed on May 15, 2006.

(51) Int. Cl.
*H01L 41/053* (2006.01)
*H01L 41/09* (2006.01)

(52) U.S. Cl. .................. 310/329; 310/348

(58) Field of Classification Search ............ 310/321, 310/324, 328, 329, 345, 348; 417/413.2
See application file for complete search history.

(56) References Cited

U.S. PATENT DOCUMENTS

| | | | |
|---|---|---|---|
| 3,439,128 A | 4/1969 | Sobel et al. | |
| 5,760,527 A | 6/1998 | Ashizawa | |
| 5,780,958 A * | 7/1998 | Strugach et al. ............ | 310/348 |
| 5,825,383 A | 10/1998 | Abe et al. | |
| 6,392,329 B1 | 5/2002 | Bryant et al. | |
| 2002/0084723 A1* | 7/2002 | Kawazoe .................... | 310/348 |
| 2003/0137216 A1* | 7/2003 | Tamayo de Miguel et al. ............ | 310/311 |
| 2004/0047625 A1 | 3/2004 | Ito et al. | |
| 2005/0244288 A1 | 11/2005 | O'Neill | |
| 2006/0051232 A1 | 3/2006 | Ooi et al. | |
| 2007/0200457 A1 | 8/2007 | Heim et al. | |

FOREIGN PATENT DOCUMENTS

WO    02/073799 A1    9/2002

OTHER PUBLICATIONS

International Search Report and Written Opinion mailed Feb. 26, 2008 in PCT application PCT/US07/11492.
U.S. Office Action mailed Aug. 6, 2008 in co-pending U.S. Appl. No. 11/747,450.
U.S. Office Action mailed Aug. 5, 2008 in co-pending U.S. Appl. No. 11/747,516.
International Search Report and Written Opinion mailed Aug. 12, 2008 in PCT application PCT/US07/11494.
International Search Report and Written Opinion mailed Aug. 8, 2008 in corresponding PCT application PCT/US07/11493.

* cited by examiner

*Primary Examiner*—Walter Benson
*Assistant Examiner*—Derek J Rosenau
(74) *Attorney, Agent, or Firm*—Nixon & Vanderhye, P.C.

(57) ABSTRACT

A motion amplifier (22) comprises piezoelectric diaphragm (30) and drive electronics (26) for applying a drive signal to the piezoelectric diaphragm. The motion amplifier preferably comprises (in addition to the piezoelectric diaphragm) a reaction mass (34) connected to the piezoelectric diaphragm; a reacted mass (40) connected to the piezoelectric diaphragm; and, a reacted mass spring (50, 270) for resiliently carrying the reacted mass. Motion or displacement of the piezoelectric diaphragm (30) is amplified to produce a greater displacement or motion of an actuator region or surface (46) of the reacted mass (40).

44 Claims, 12 Drawing Sheets

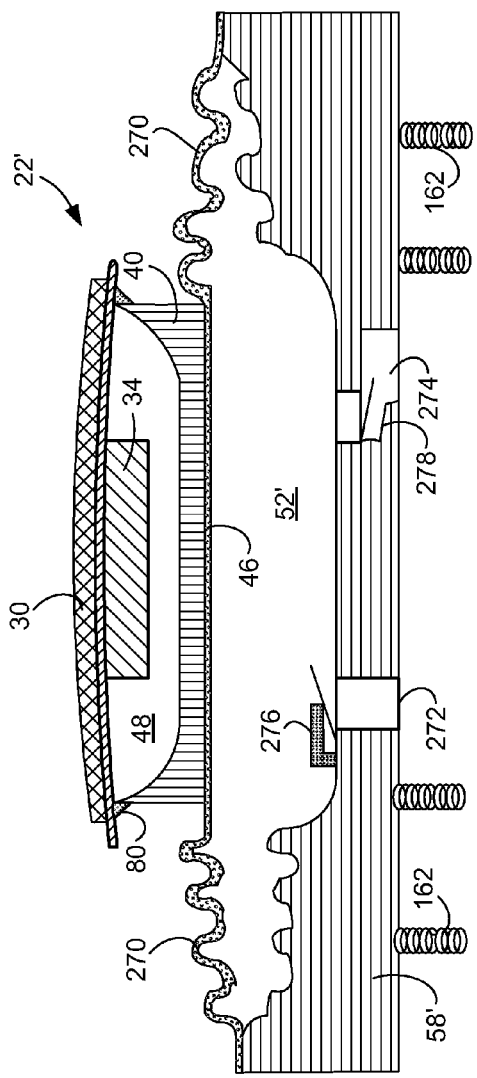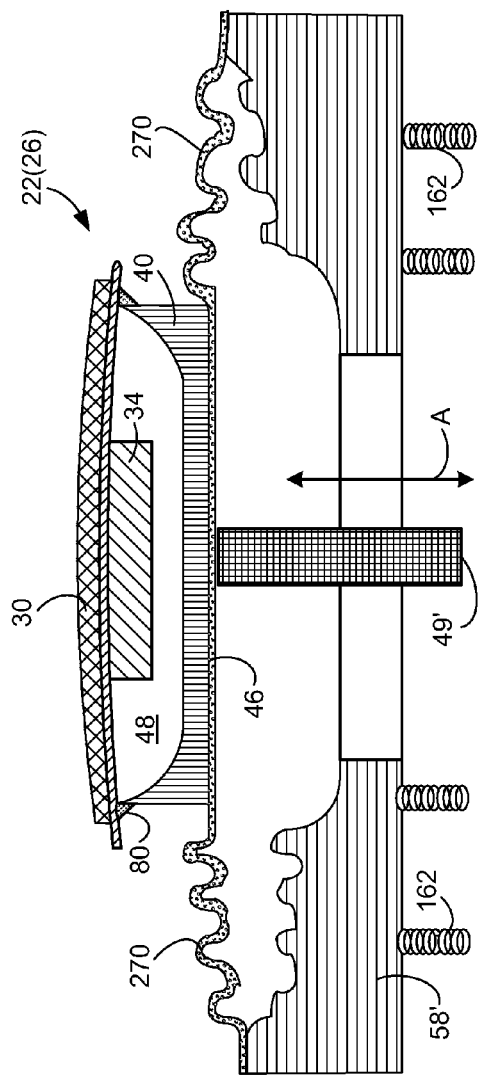

MOTION AMPLIFICATION USING PIEZOELECTRIC ELEMENT

This application claims the benefit and priority of the following United States provisional patent applications, all of which are incorporated herein by reference in their entirety: U.S. Provisional Patent application 60/747,286, entitled "COMPRESSOR AND COMPRESSION USING MOTION AMPLIFICATION"; U.S. Provisional Patent application 60/747,287, entitled "MOTION AMPLIFICATION USING PIEZOELECTRIC ELEMENT"; and U.S. Provisional Patent application 60/747,289 all filed May 15, 2006, entitled "VIBRATION AMPLIFICATION SYSTEM FOR PIEZOELECTRIC ACTUATORS AND DEVICES USING THE SAME". This application is related to the following simultaneously-filed US Patent applications, both of which are incorporated herein by reference: U.S. patent application Ser. No. 11/747,450, entitled "COMPRESSOR AND COMPRESSION USING MOTION AMPLIFICATION" and U.S. patent application Ser. No. 11/747,516 entitled "VIBRATION AMPLIFICATION SYSTEM FOR PIEZOELECTRIC ACTUATORS AND DEVICES USING THE SAME".

BACKGROUND

1. Field of the Invention

The present invention pertains to amplification of motion such as vibration motion, and particularly to amplification of motion caused by a piezoelectric diaphragm or the like.

2. Related Art and Other Considerations

Piezoelectric diaphragms have been employed in various types of pumps and actuators. As is well known, a piezoelectric material is polarized and will produce an electric field when the material changes dimensions as a result of an imposed mechanical force. This phenomenon is known as the piezoelectric effect. Conversely, an applied electric field can cause a piezoelectric material to change dimensions.

One exemplary piezoelectric diaphragm, known as a ruggedized laminated piezoelectric or RLP™, has a central piezoelectric wafer which is laminated to a stainless steel substrate and preferably also has an aluminum cover laminated thereover. Examples of such RLP™ elements, and in some instances pumps employing the same, are illustrated and described in one or more of the following: PCT Patent Application PCT/US01/28947, filed 14 Sep. 2001; U.S. patent application Ser. No. 10/380,547, filed Mar. 17, 2003, entitled "Piezoelectric Actuator and Pump Using Same"; U.S. patent application Ser. No. 10/380,589, filed Mar. 17, 2003, entitled "Piezoelectric Actuator and Pump Using Same", and U.S. patent application Ser. No. 11/279,647 filed Apr. 13, 2006, entitled "PIEZOELECTRIC DIAPHRAGM ASSEMBLY WITH CONDUCTORS ON FLEXIBLE FILM", all of which are incorporated herein by reference.

The displacement of a ruggedized laminated piezoelectric, while large compared to other piezoelectric devices, is still small in relation to the diameter of a pumping chamber in which it can be employed. Hence, compression ratios are still small, e.g., in a range on the order of 1.1 to 1.0, for example. An increased stroke for the piezoelectric diaphragm would facilitate an increased compression ratio.

What is needed, therefore, and an object of the present invention, are apparatus, method, and technique for achieving motion amplification of a piezoelectric element.

BRIEF SUMMARY

A motion amplifier preferably comprises a piezoelectric diaphragm and drive electronics for applying a drive signal to the piezoelectric diaphragm; a reaction mass connected to the piezoelectric diaphragm; a reacted mass connected to the piezoelectric diaphragm; and, a reacted mass spring for resiliently carrying the reacted mass. The reacted mass either forms or is connected to an actuator portion or actuator surface which, in turn, either forms or is connected to an actuator element. For example, the actuator portion or surface can serve as a piston head or a cylinder head, or as a surface or portion to which a further element such as an actuator shaft of the like can be connected.

The structure of the motion amplifier carried by the reacted mass spring (e.g., the piezoelectric diaphragm, the reaction mass, and the reacted mass) has a resonant frequency $f2$. The resonant frequency $f2$ is related to a spring constant $K2$ of the reacted mass spring and a spring constant of any load upon which the reacted mass acts, as well as a sum of masses of the reaction mass and the reacted mass. Preferably the predetermined frequency is $f2$, which means that the drive signal is generated to maintain the motion amplifier resonant at a frequency $f2$, e.g., the drive signal is generated to urge the motion amplifier to the frequency $f2$ as its operational frequency. Driving the motion amplifier 22 at the frequency $f2$ achieves peak amplitude displacement of the motion amplifier, and thus peak displacement of the actuator portion or actuator surface.

The drive electronics generates a drive signal to maintain the motion amplifier resonant at a predetermined frequency. In particular, in an example illustrated embodiment the drive electronics generates the drive signal to maintain a predetermined phase angle between the drive signal and a signal indicative of displacement of the motion amplifier system. To this end, the drive electronics comprises a sensor for sensing displacement of the motion amplifier and for generating the signal indicative of displacement of the motion amplifier.

In one example embodiment, the piezoelectric diaphragm is mounted to and carried by the reacted mass. The reacted mass comprises a reacted mass cup which defines a reacted mass cavity. In one example implementation of this embodiment, a periphery of the piezoelectric element is held by the reacted mass cup while the center of the piezoelectric diaphragm is free to vibrate. The reaction mass is preferably centrally suspended from the piezoelectric diaphragm in the reacted mass cavity.

Differing types of utilization devices can incorporate the embodiments of motion amplifiers. The utilization devices can include or interface with an amplifier base which carries the piezoelectric diaphragm, the reaction mass, the reacted mass, and the reacted mass spring. As one aspect of the technology, means are provided for resiliently mounting the amplifier base relative to the outside world, and thereby mitigating any damping caused by the outside world.

In one example embodiment of a motion amplifier, the reacted mass spring comprises a diaphragm. The diaphragm comprising the reacted mass spring is a preferably a corrugated diaphragm. Corrugation of the diaphragm provides increased motion for the motion amplifier.

Another example embodiment of a motion amplifier comprises a bellows assembly. The bellows assembly has a sidewall which serves as, e.g., the reacted mass spring.

The technology also includes a method of operating a motion amplifier. The method includes generating and applying a drive signal to the piezoelectric diaphragm, the drive signal preferably being generated to maintain the motion amplifier resonant at a predetermined frequency. Preferably, the method includes generating the drive signal to urge the motion amplifier to the frequency $f2$ as its operational frequency.

A further aspect of the method includes resiliently mounting the motion amplifier (e.g., via its amplifier base) relative to the outside world.

BRIEF DESCRIPTION OF THE DRAWINGS

The foregoing and other objects, features, and advantages of the invention will be apparent from the following more particular description of preferred embodiments as illustrated in the accompanying drawings in which reference characters refer to the same parts throughout the various views. The drawings are not necessarily to scale, emphasis instead being placed upon illustrating the principles of the invention.

FIG. 13 is a schematic sectioned view of portions of a motion amplifier according to another example embodiment.

FIG. 14 is a schematic sectioned view of portions of an actuator shaft according to another example embodiment.

DETAILED DESCRIPTION

In the following description, for purposes of explanation and not limitation, specific details are set forth such as particular architectures, interfaces, techniques, etc. in order to provide a thorough understanding of the present invention. However, it will be apparent to those skilled in the art that the present invention may be practiced in other embodiments that depart from these specific details. That is, those skilled in the art will be able to devise various arrangements which, although not explicitly described or shown herein, embody the principles of the invention and are included within its spirit and scope. In some instances, detailed descriptions of well-known devices, circuits, and methods are omitted so as not to obscure the description of the present invention with unnecessary detail. All statements herein reciting principles, aspects, and embodiments of the invention, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

Thus, for example, it will be appreciated by those skilled in the art that block diagrams herein can represent conceptual views of illustrative circuitry embodying the principles of the technology. The functions of the various elements including functional blocks labeled as "processors" or "controllers" may be provided through the use of dedicated hardware as well as hardware capable of executing software in association with appropriate software. When provided by a processor, the functions may be provided by a single dedicated processor, by a single shared processor, or by a plurality of individual processors, some of which may be shared or distributed. Moreover, explicit use of the term "processor" or "controller" should not be construed to refer exclusively to hardware capable of executing software, and may include, without limitation, digital signal processor (DSP) hardware, read only memory (ROM) for storing software, random access memory (RAM), and non-volatile storage.

Figure 1:
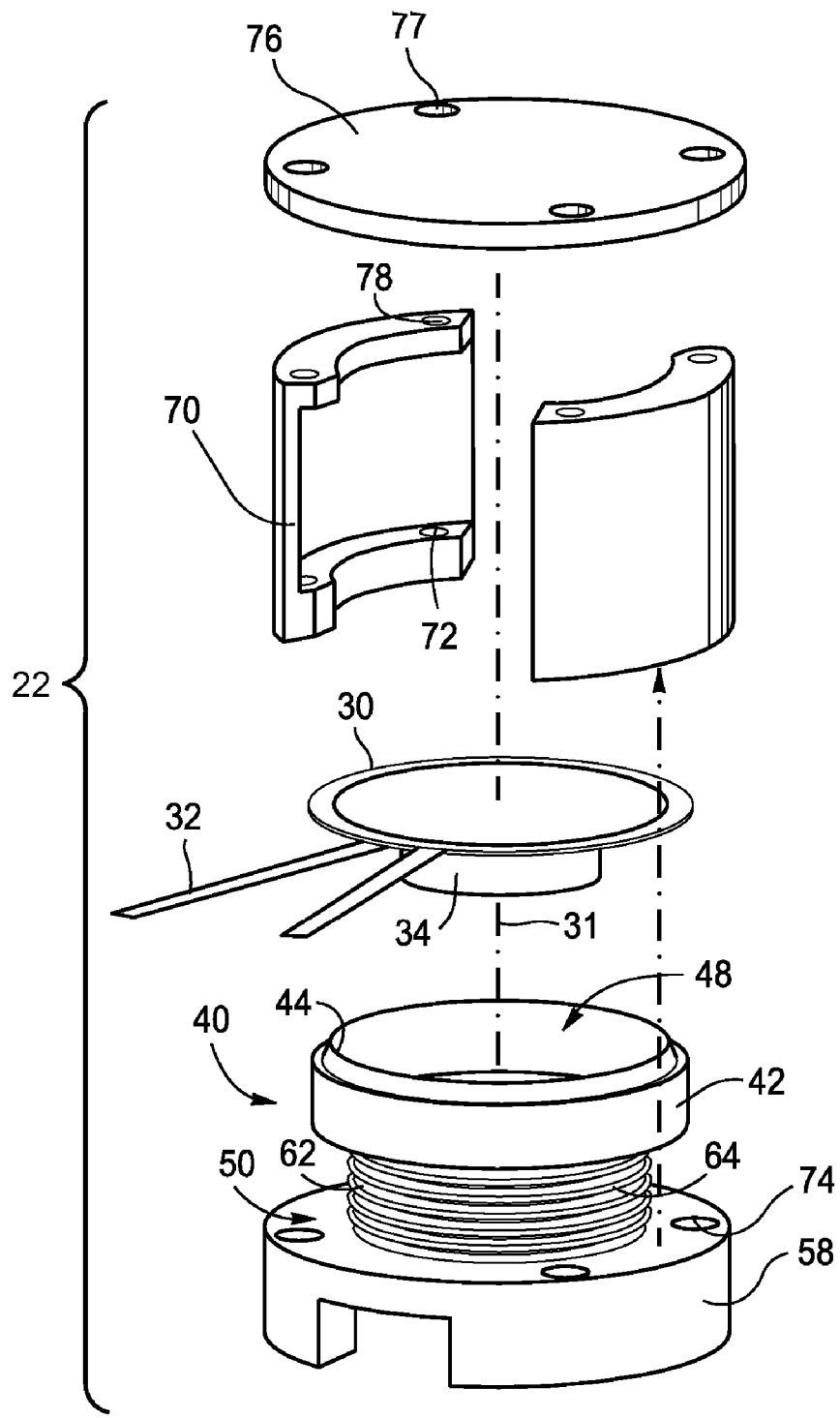
FIG. 1 is an exploded view of an example embodiment of a motion amplifier.
Figure 2:
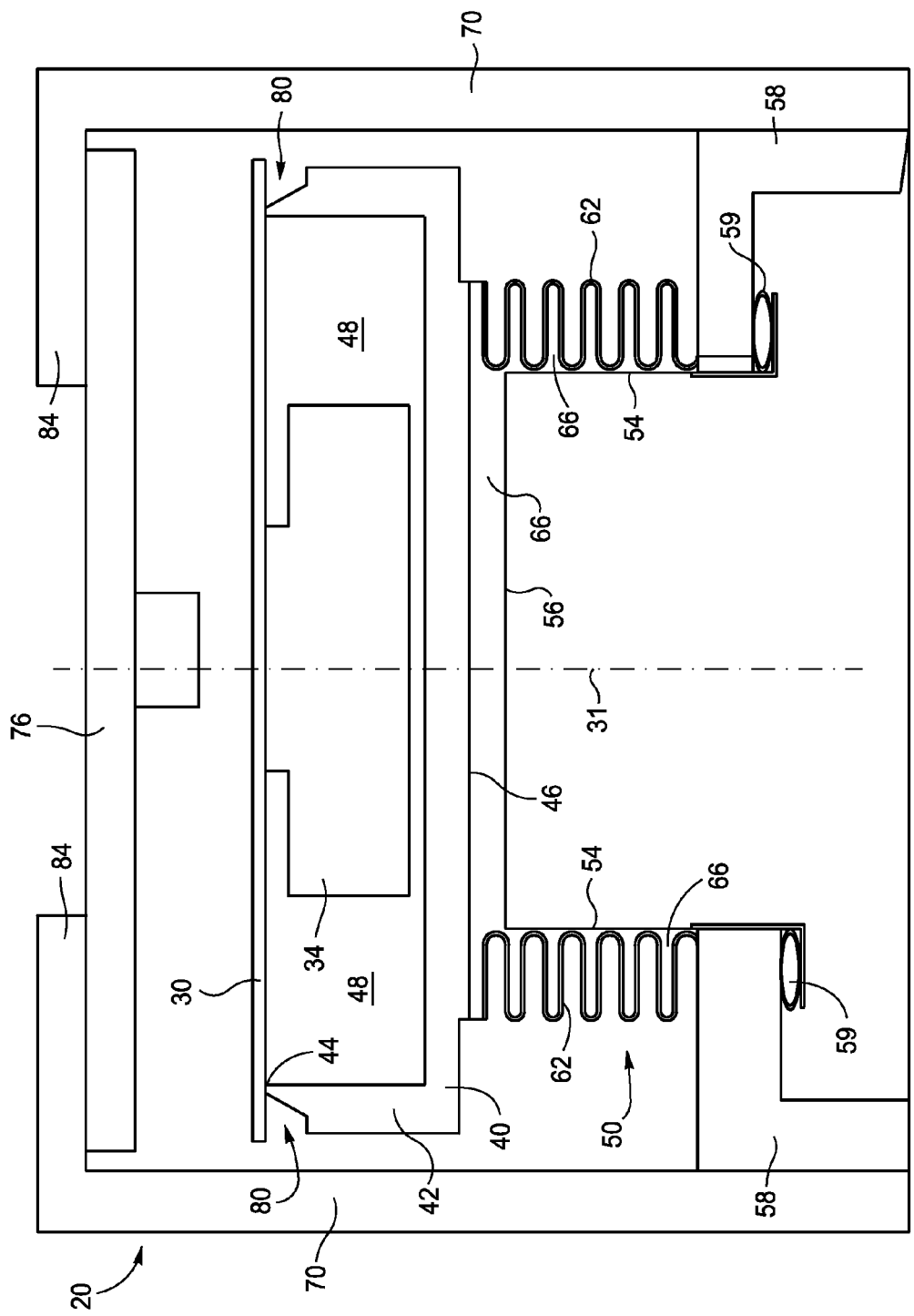
FIG. 2 is a sectioned view of portions of the motion amplifier of FIG. 1 wherein the motion amplifier acts through an actuator portion of surface.

FIG. 1 and FIG. 2 illustrate an example, non-limiting embodiment of a motion amplifier 22. The motion amplifier 22 can serve as a driver or actuator for a utilization device. Included in motion amplifier 22 is a sensor and control system, an example embodiment of which is illustrated as sensor and control system 26 illustrated in FIG. 6. As used herein, "drive electronics" encompasses one or more elements of sensor and control system 26.

The motion amplifier 22 comprises an actuator or motion initiator element which, in the illustrated example embodiment, takes the form of a piezoelectric diaphragm 30. The piezoelectric diaphragm 30 is mounted (such as by example ways described hereinafter) preferably with its peripheral edge constrained and in a manner to permit its central portion to move, displace, or deflect through a range of positions in accordance with a drive signal applied to piezoelectric diaphragm 30 by sensor and control system 26. For example, when a zero volt signal is applied to piezoelectric diaphragm 30, the piezoelectric diaphragm 30 has a slightly domed configuration with respect to an axial direction 31. On the other hand, upon application of a non-zero voltage piezoelectric the central region of diaphragm 30 may displace or dome more significantly. In the illustrated embodiment, the drive signal is applied to motion initiator element 30 by radially extending electrodes 32.

The piezoelectric diaphragm 30, serving as the motion initiator element, has a reaction mass 34 mounted or adhered to an underside of its central region. Although shown in the illustrated embodiment as being a disc, reaction mass 34 can take a variety of other shapes.

The piezoelectric diaphragm 30 is mounted to and carried by a reacted mass which includes a reacted mass cup 40. The reacted mass cup 40 is preferably cylindrical in shape, having a cylindrical sidewall 42 which is surmounted by a relatively thinner or sharp crown or "knife edge" 44 (see FIG. 1 and FIG. 2). The reacted mass cup 40 has an essentially flat bottom wall 46 (see FIG. 2) which also serves essentially as a piston head or cylinder head or compressor head. A reacted mass cup cavity 48 is formed interior to the cylindrical side wall 42. The reacted mass cup cavity 48 is sized so that reaction mass 34, suspended on the underside of piezoelectric diaphragm 30, is accommodated in reacted mass cup cavity 48. The perimeter of piezoelectric diaphragm 30 sits on reacted mass cup crown edge 44. Thus, in the example implementation shown in FIG. 1, a periphery of the piezoelectric element 30 is held by the reacted mass cup 48 while the center of the piezoelectric diaphragm 30 is free to vibrate. The reacted mass need not take the form of a cup, but can have other configurations. The reaction mass 34 is preferably centrally suspended from the piezoelectric diaphragm 30 in the reacted mass cup cavity 48.

Figure 3:
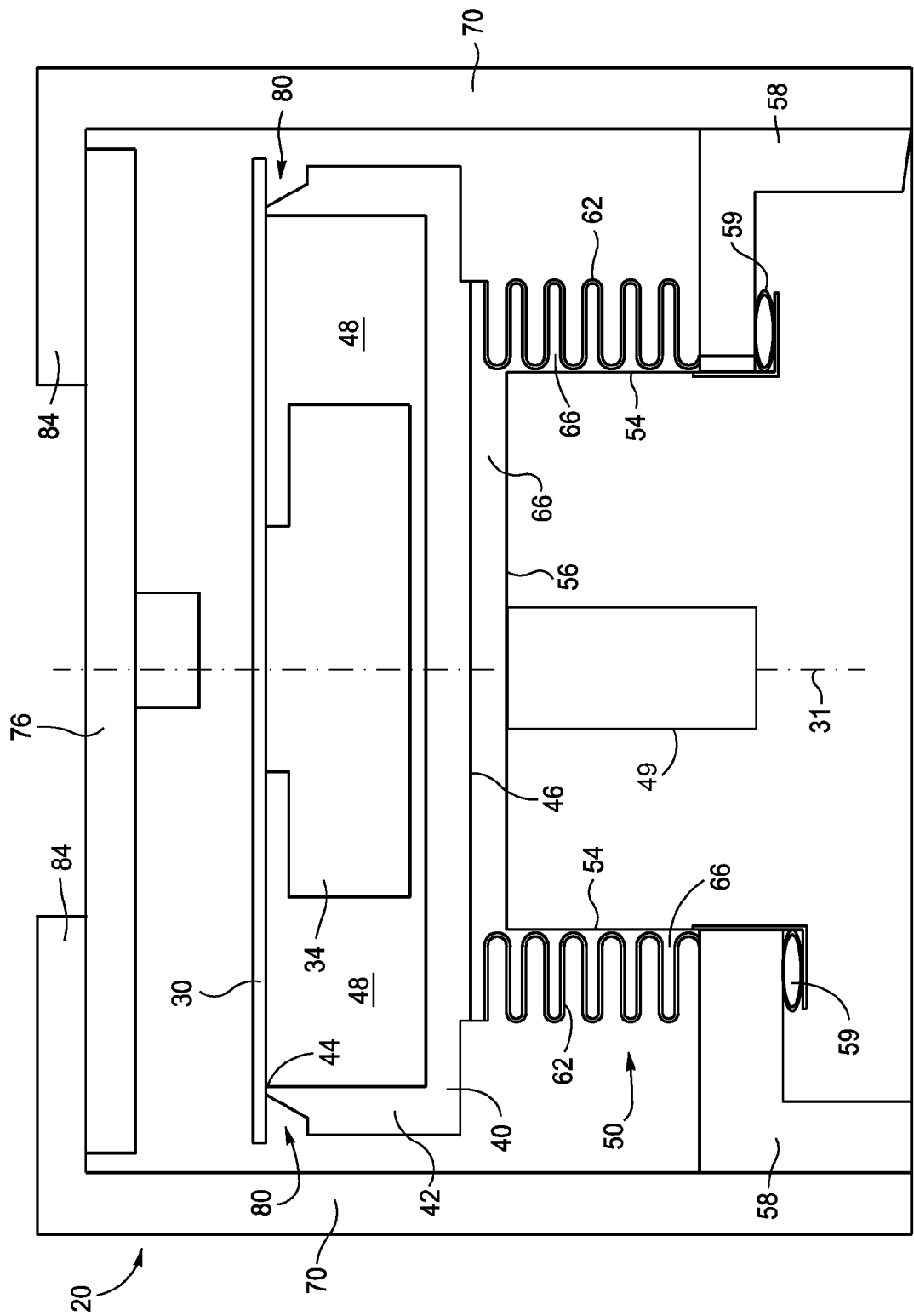
FIG. 3 is a sectioned view of portions of the motion amplifier of FIG. 1 wherein the motion amplifier acts through an actuator portion of surface which has an actuator shaft or actuator element attached thereto.

The reacted mass 40 either forms or is connected to an actuator portion or actuator surface, such as the essentially flat bottom wall 46 described above. The actuator portion or actuator surface can, in turn, either form or be connected to an actuator element. For example, the actuator portion or surface can serve as a piston head or a cylinder head. In this regard, FIG. 2 shows actuator portion of surface 46 as being essentially flat, which is suitable for forming a piston head or cylinder head or the like. Alternatively, the actuator portion of surface of reacted mass 40 can have a further element such as an actuator shaft of the like can be connected. In this latter regard, FIG. 3 shows bottom wall 46 of reacted mass 40 has having an actuator shaft 49 attached thereto. The actuator shaft 49 can either abut a contact element or other surface in a utilization device in conjunction with which the motion amplifier 22 works, or serve as a linkage or part of a linkage for such a utilization device.

Suspended in axial direction 31 from reacted mass cup 40 is a bellows assembly 50. As shown in FIG. 2, bellows assembly 50 has an essentially inverted-cup shape. The interior cylindrical wall 54 can be connected to amplifier base 58 by bellows seal 59.

The bellows assembly 50 further comprises a resilient and flexible exterior cylindrical sidewall 62. The bellows exterior sidewall 62 can be pleated in resilient fashion or, more preferably, has a coiled spring 64 or other elastic member embedded therein or carried thereon. A bottom of bellows exterior sidewall 62 is mounted to a top of amplifier base 58; a top of bellows exterior sidewall 62 is sealingly connected to an underside of reacted mass cup bottom wall 46. As shown in FIG. 2, a compression space 66 is defined between bellows interior cylindrical wall 54 and bellows exterior sidewall 62.

In the example embodiment illustrated in FIG. 1, motion amplifier 22 has one or more amplifier sleeve sections 70 which at least partially surround piezoelectric diaphragm 30, reacted mass cup 40, and the flexible portion of bellows assembly 50. The amplifier sleeve 70 can be a single hollow cylindrical member which essentially completely encloses these interior elements, or two or more sections (which, when positioned, define a cylindrical cavity) as shown in FIG. 1. In the illustrated embodiment, the amplifier sleeve section(s) 70 can be affixed or fastened to a top surface of amplifier base 58, as evidenced by aligned fastener holes 72 and 74 formed in amplifier sleeve sections 70 and amplifier base 58, respectively. In addition, the motion amplifier 22 is covered by a ceiling board 76 which is mounted, affixed, or fastened to amplifier sleeve section(s) 70. For example, ceiling board 76 can be fastened to amplifier sleeve section(s) 70 as evidenced by aligned fastener holes 77 and 78 formed in ceiling board 76 and amplifier sleeve section(s) 70, respectively. As explained subsequently, ceiling board 76 can carry some or all portions of sensor and control system 26.

As mentioned above, and as shown in FIG. 2, piezoelectric diaphragm 30 is carried on reacted mass cup crown edge 44. The peripheral edge of piezoelectric diaphragm 30 can be constrained by any of several mounting methods. For example, a bead of an adhesive or the like can be applied circumferentially underneath piezoelectric diaphragm 30 and around reacted mass cup crown edge 44 in the region 80 illustrated in FIG. 2. Such adhesive should preferably be sufficiently sticky but also allow shear movement between layers of the piezoelectric diaphragm 30. One example of such adhesive is a 467MP adhesive supplied by Minnesota Mining & Manufacturing.

Figure 4A:
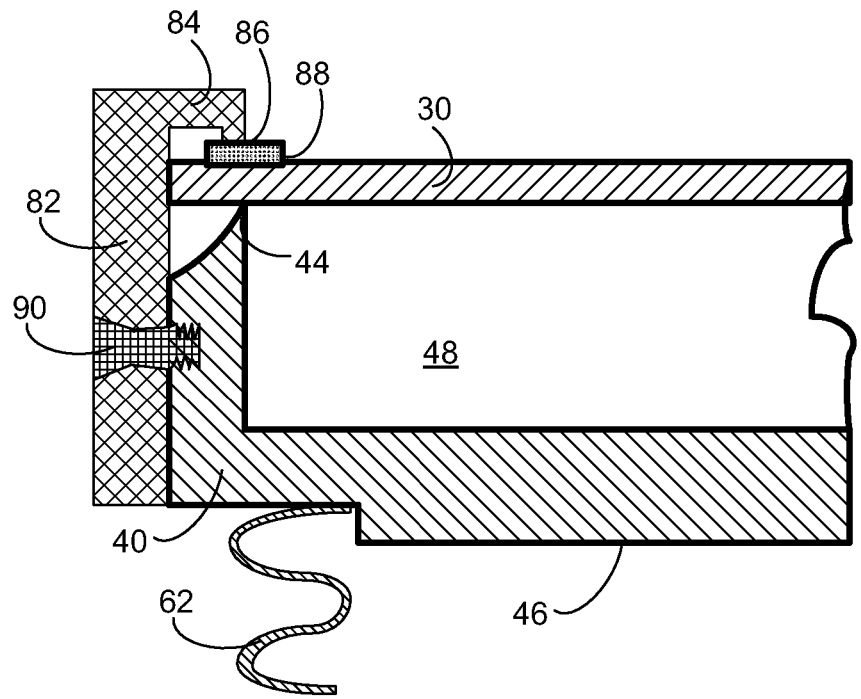
FIG. 4A is a sectioned view showing portions of a motion amplifier and an alternate way of retaining the motion amplifier in place.

As another example, illustrated in FIG. 4A, an intermediate clamping sleeve 82 can be arranged circumferentially around piezoelectric diaphragm 30 and reacted mass cup 40. The intermediate clamping sleeve 82 has an overhanging rim section 84 which has a distal depending contact foot 86. A (rubber) gasket 88 or the like is interposed between contact foot 86 and an upper circumferential edge of piezoelectric diaphragm 30, to apply a retaining force on the top periphery of piezoelectric diaphragm 30. The intermediate clamping sleeve 82 is retained in position by affixation to the exterior sidewall of reacted mass cup 40 by, e.g., fasteners or the like such as fastener 90 illustrated in FIG. 4A.

In a yet further alternate implementation, rather than or in addition to having fastener 90, intermediate clamping sleeve 82 has a bottom rim 92. In the FIG. 4B embodiment, piezoelectric diaphragm 30 and reacted mass cup 40 are securely clamped between overhanging rim section 84 and bottom rim 92 of intermediate clamping sleeve 82.

Figure 9A:
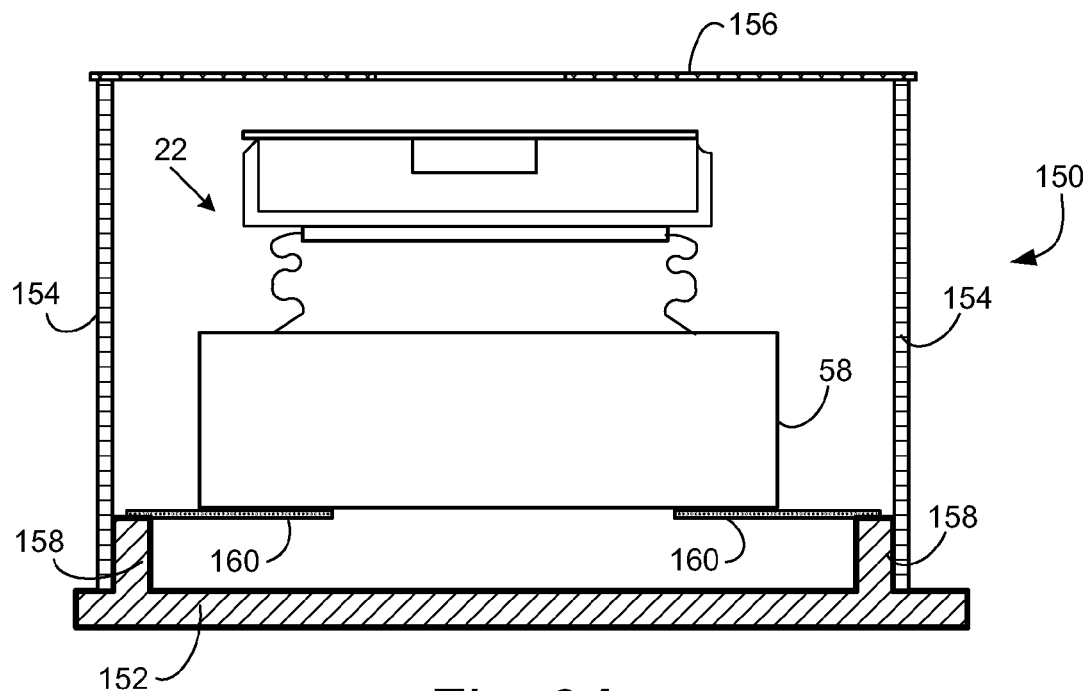
FIG. 9A is a cross sectional view showing an example motion amplifier and a first mode of resiliently mounting the motion amplifier.

The motion amplifier 22 is resiliently mounted with respect to the outside world. Resilient mounting of motion amplifier 22 can be accomplished in several ways. As a first example, FIG. 9A shows motion amplifier as being located at least partially within a housing 150. The housing 150 comprises a housing base 152; one or more housing sidewall(s) 154; and housing cover 156. The housing base 152 can have a plurality of short mounting pedestals 158 extending upwardly therefrom, with the mounting pedestals 158 being positioned in a pattern or arrangement adapted for support of the motion amplifier 22. However, motion amplifier 22 does not rest on mounting pedestals 158 directly. Rather, the mounting pedestals 158 have proximal ends of resilient beams 160 mounted thereto in cantilever fashion. The motion amplifier 22 is situated on distal or second ends of the resilient beams 160. For example, an underside of amplifier base 58 can be fixedly mounted to upper surfaces of resilient beams 160. The resilient beams 160 can be, for example, a springy or resilient metallic material. Thus, in the implementation of FIG. 9A, the motion amplifier 22 is mounted on a series of radially extending (with respect to axial direction 31) resilient cantilever beams 160 which resemble diving boards.

Figure 9B:
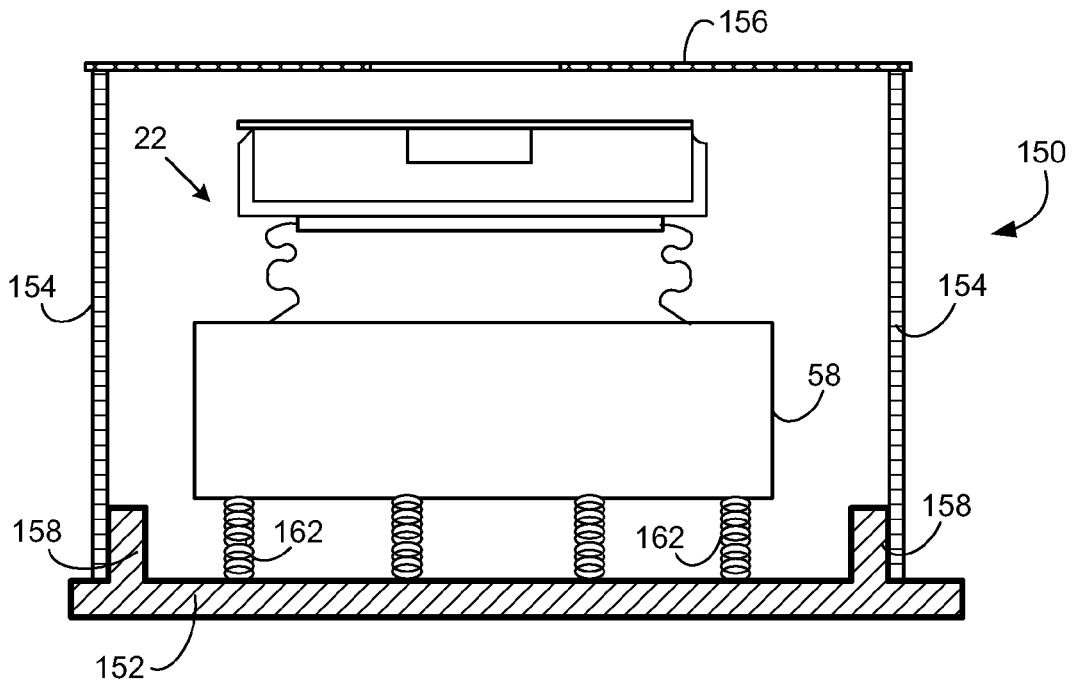
FIG. 9B is a cross sectional view showing an example motion amplifier and a second mode of resiliently mounting the motion amplifier.

Alternatively, as shown in FIG. 9B, motion amplifier 22 can be resiliently mounted on coiled springs 162. The coiled springs 162 can be circularly mounted, for example, on housing base 152, and have one end connected to a top surface of housing base 152 and another end connected to an underside of amplifier base 58.

Figure 7:
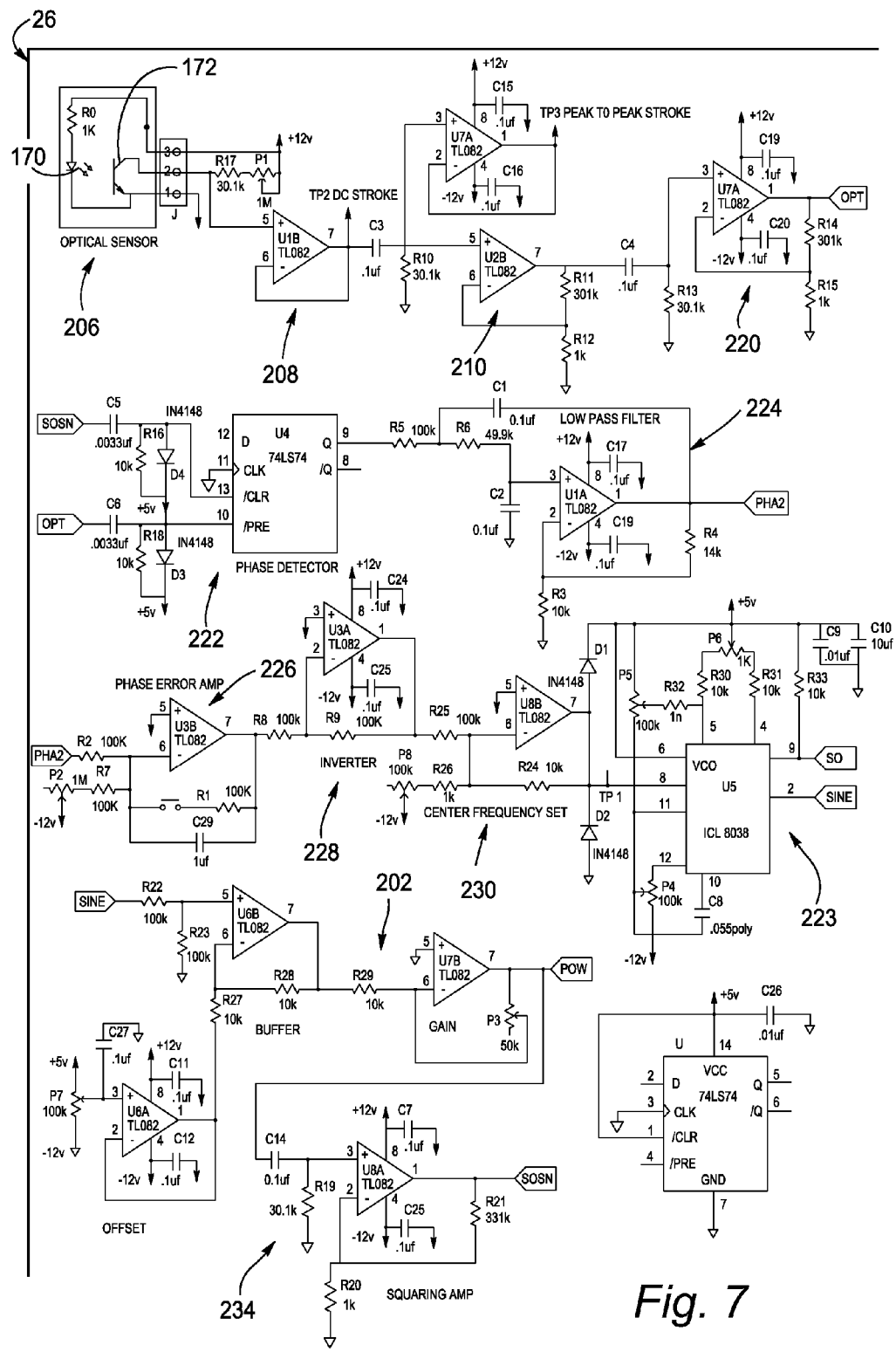
FIG. 7 is a schematic view of control circuit for the motion amplifier of FIG. 1.

In an illustrated embodiment of FIG. 1 and FIG. 7, motion amplifier 22 has a peripheral edge of its piezoelectric diaphragm 30 attached or secured (e.g., with a flexible epoxy) to reacted mass cup crown edge 44 so that the periphery of piezoelectric diaphragm 30 is constrained while the piezoelectric diaphragm 30 is otherwise free to flex. The piezoelectric diaphragm 30 flexes as a voltage is applied from sensor and control system 26 via electrodes 32. The reaction mass 34 is carried by piezoelectric diaphragm 30 to increase its inertia. The flexing of piezoelectric diaphragm 30 reciprocates reaction mass 34. By Newton's Third Law, the moving mass produces a force on reacted mass cup 40. Thus, the energy input is transformed first to a force and ultimately to motion of reacted mass cup 40 and of reacted mass cup bottom wall 46, which serves as an actuator region or surface (e.g., as a compression head or piston head). The reacted mass cup 40 vibrates and its actuator portion or surface 36 deflects. As explained subsequently, large deflections of actuator portion or actuator surface 36 are produced when the piezoelectric diaphragm 30 is driven/operated at the resonant frequency of the piston head assembly, e.g., the assembly carried by bellows assembly 50. The maximum stroke of the piston head is limited only by structural damping. In an example implementation, such damping is on the order of 3%-6% of critical damping, so the maximum stroke can be ten to thirty times the stroke or displacement of the piezoelectric diaphragm 30 itself.

There is an energy cost to operating at resonance. The work done against the internal losses is not useful work and it increases with stroke. Fortunately, this component of the total work is manageable. In fact, this work term is masked by the capacitor-like nature of the piezoelectric diaphragm 30 with a conventional drive circuit. The pumping work is equivalent to a damping term.

The motion amplifier 22 thus can be used in various contexts, one of which is that of a compressor. In such a compressor, the actuator region or actuator surface 46 can act on a fluid (e.g., liquid or gas) in a compression chamber, by creating a variable volume in the compression chamber. A non-limiting example of such a compressor is illustrated in U.S. Provisional Patent application 60/747,286, entitled "COMPRESSOR AND COMPRESSION USING MOTION AMPLIFICATION", which is incorporated herein by reference in its entirety.

Preferably motion amplifier 22 works in conjunction with a motion sensing system. In one non-limiting example embodiment, such a motion sensing system can include an optical emitter 170 and an optical sensor 172 (e.g., phototransistor). The optical emitter 170 is positioned to direct an electromagnetic (e.g., optical) beam onto a top surface of piezoelectric diaphragm 30. The optical sensor 172 is situated and positioned to detect reflection of the beam from piezoelectric diaphragm 30.

Figure 5A:
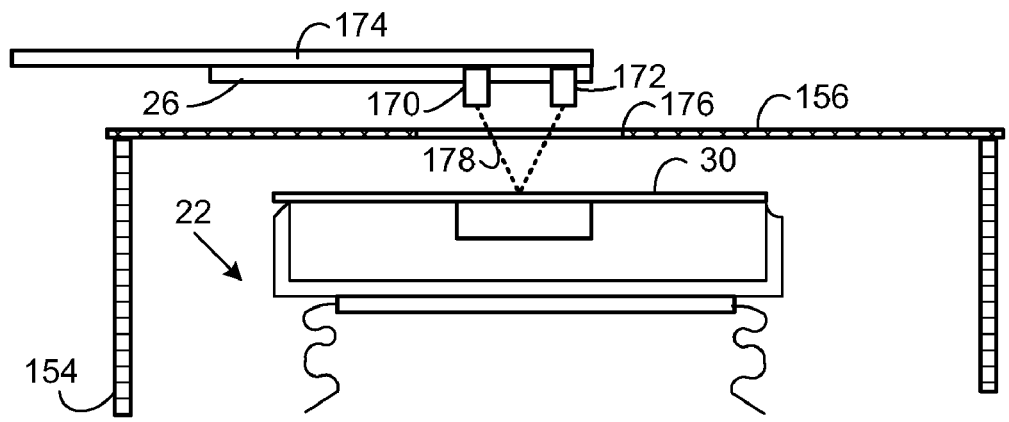
FIG. 5A is a partial cross sectional view showing an example technique for mounting a sensor system for a motion amplifier.

FIG. 5A shows a first example technique for mounting optical emitter 170 and optical sensor 172. In the technique of FIG. 5A, optical emitter 170 and optical sensor 172 are both mounted on an underside of a sensor system cantilever support member 174. The sensor system cantilever support member 174 is held aloft above housing 150. The housing cover 156 of housing 150 has a cover aperture 176 which is preferably centrally located above a center portion of piezoelectric diaphragm 30. The optical emitter 170 and optical sensor 172 are held by sensor system cantilever support member 174 so that optical emitter 170 directs a beam 178 toward the (preferably shiny) top surface of piezoelectric diaphragm 30, and so that optical sensor 172 receives the beam as reflected by piezoelectric diaphragm 30. If desired, the aforementioned sensor and control system 26 can also be mounted on sensor system cantilever support member 174, e.g., on an underside of sensor system cantilever support member 174.

Figure 4B:
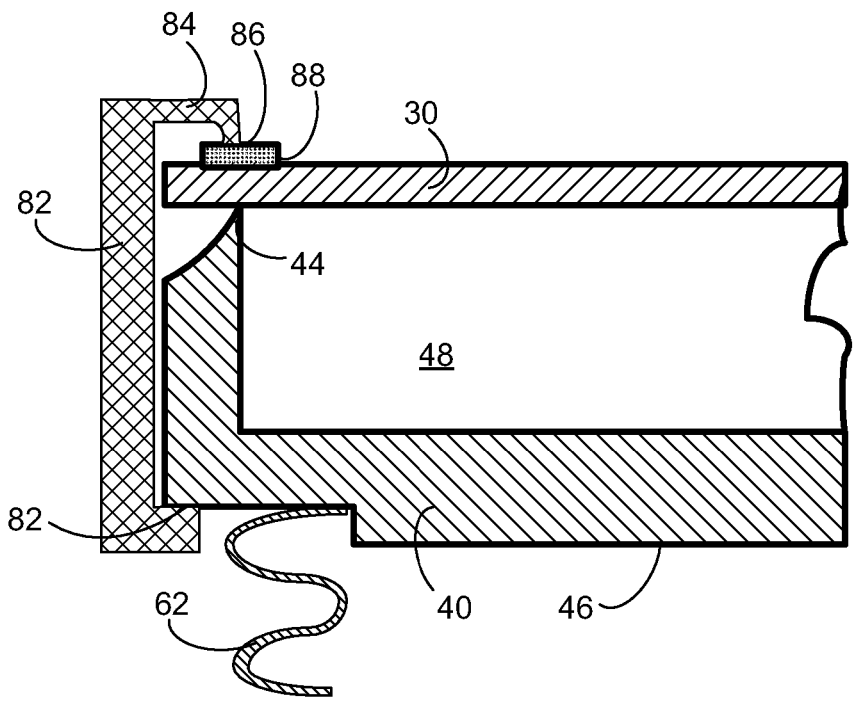
FIG. 4B is a sectioned view showing portions of a motion amplifier and another alternate way of retaining the motion amplifier in place.
Figure 5B:
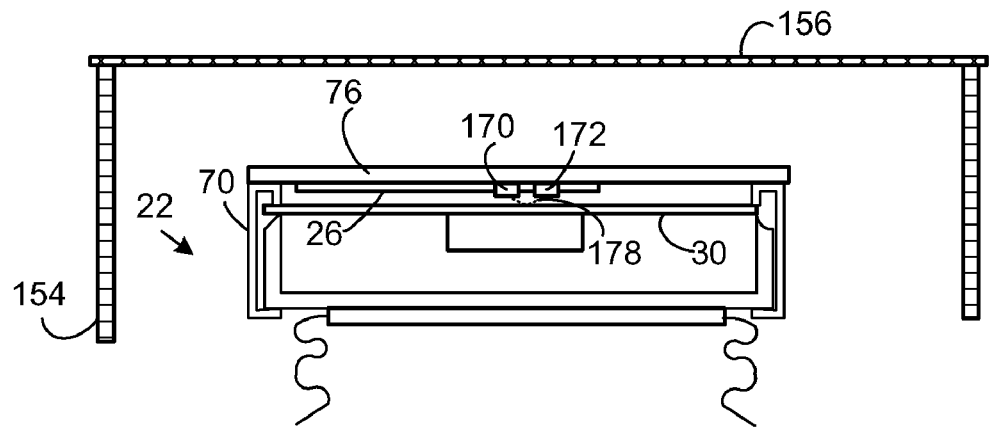
FIG. 5B is a partial cross sectional view showing another example technique for mounting a sensor system for a motion amplifier.

FIG. 5B shows another example technique for mounting optical emitter 170 and optical sensor 172. The FIG. 5B technique is useful for an embodiment of a motion amplifier which has one or more amplifier sleeve sections 70 such as illustrated in FIG. 1 and FIG. 4A and FIG. 4B, with a ceiling board 76 which fits over amplifier sleeve sections 70. In the FIG. 5B technique, the optical emitter 170 and sensor system cantilever support member 174 are mounted on the underside of ceiling board 76. Again, if desired, the sensor and control system 26 can also be mounted as a circuit board on the underside of ceiling board 76.

Figure 6:
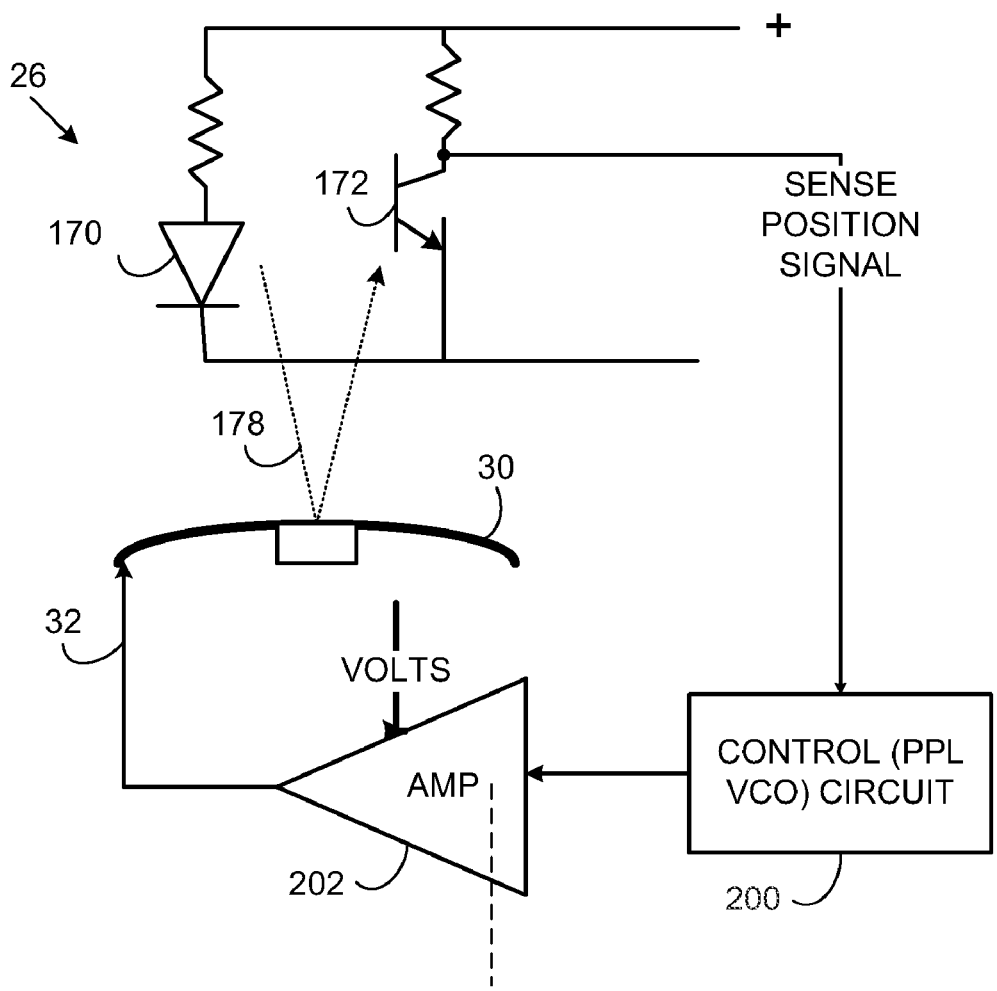
FIG. 6 is a schematic view of a generic, example sensing system for a motion amplifier.

FIG. 6 illustrates that sensor and control system 26 includes the optical emitter 170 and optical sensor 172 described above. In accordance with the amplitude of the beam reflected from the piezoelectric diaphragm 30, optical sensor 172 generates a sense position signal which is applied to control circuit 200. The value of the sense position signal indicates the degree of motion (displacement, deflection) of the entire motion amplifier. The control circuit 200, described in more detail along with other elements with reference to FIG. 7, resembles a phase locked loop voltage control output circuit. An output signal of control circuit 200 is applied to power amplifier 202, which generates the drive signal which is applied by electrodes 32 to piezoelectric diaphragm 30.

An example embodiment of control circuit 200 is illustrated in FIG. 7. In one sense, the control circuit 200 resembles a phase lock loop. However, control circuit 200 differs from a conventional phase locked loop in that the drive signal applied by control circuit 200 to piezoelectric diaphragm 30 is a sine wave (rather than a square wave) and the output of sensor and control system 26 depends on the amplitude of motion, which decreases greatly for off resonant conditions.

The control circuit 200 of FIG. 7 includes an optical sensor 206 which includes both the optical emitter 170 and optical sensor 172. A buffer 208 buffers the signal generated by optical sensor 206. The signal is amplified (two stages of amplification) by amplifier 210 and amplifier 220. The amplified signal OPT is applied to phase detector 222. The phase detector 222 detects the phase output from optical sensor 206 relative to phase output from variable frequency oscillator 223. The output from phase detector 222 is applied to low pass filter 224 to produce a phase angle signal PHAZ. The phase angle of phase angle signal PHAZ is compared to a reference by phase error amplifier 226. The compared signal is inverted by inverter 228. A frequency range selector 230 selects a frequency range, which goes to the control line for controlling the frequency. The sine wave output SINE is applied to power amplifier 202, as well as to a squaring circuit 234 which squares it and feeds it back phase detector 222.

Figure 8:
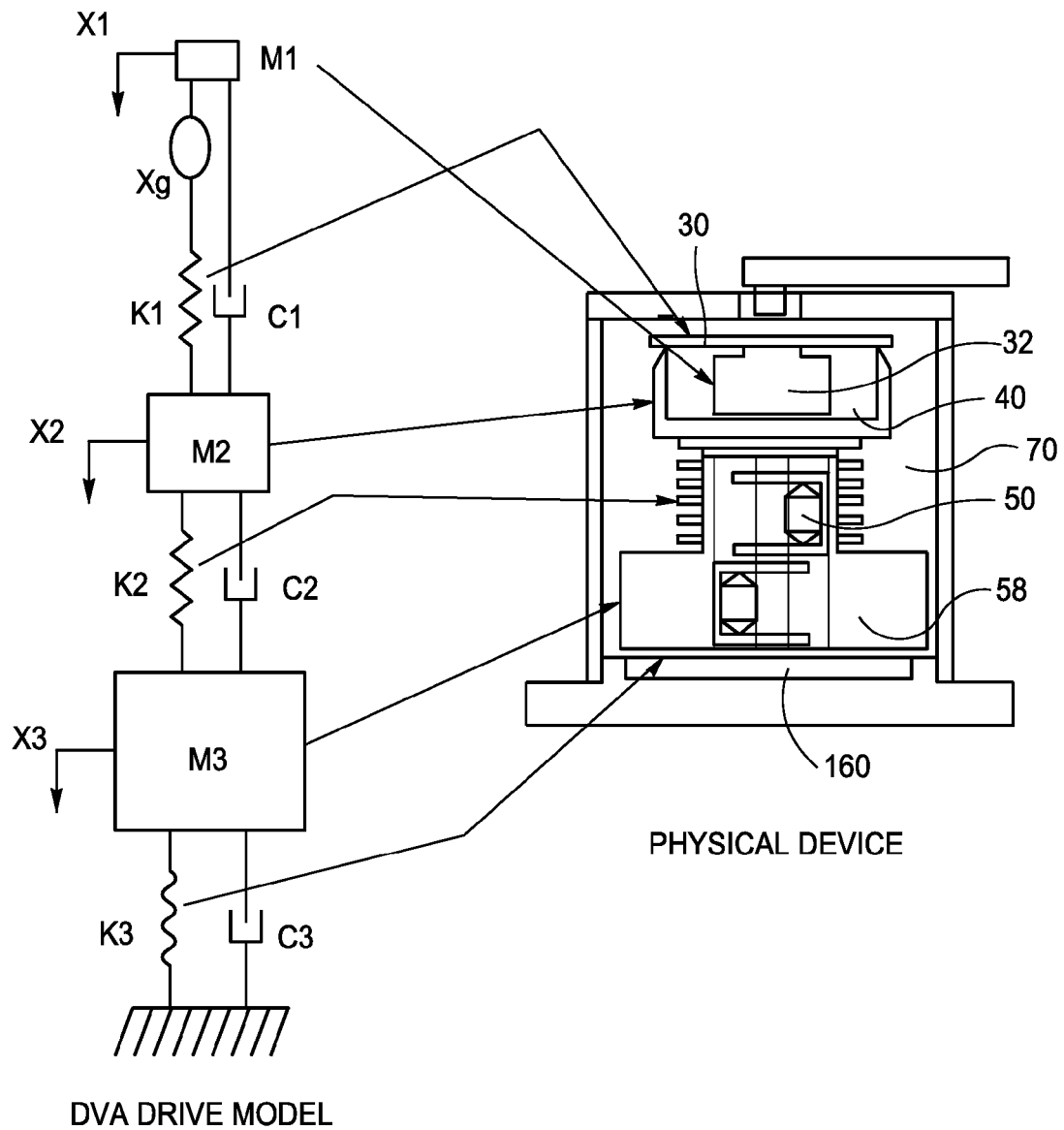
FIG. 8 is schematic view of a drive model for the motion amplifier of FIG. 1 combined with a sectioned view of the motion amplifier of FIG. 1.

As understood from the foregoing, a motion amplifier comprises a piezoelectric diaphragm, a reaction mass carried or attached to the piezoelectric diaphragm; drive electronics for driving the piezoelectric diaphragm; a reacted mass; and, a reacted mass spring. Preferably the motion amplifier, and optionally any utilization device comprised by the same, is resiliently mounted on yet another spring. These aspects of a motion amplifier can be implemented in many ways, including but not limited to the embodiments already described with reference to previously described figures. FIG. 8 shows that a generic system encompassed hereby includes a first mass M1 corresponding to the reaction mass; a first spring constant K1 corresponding to the spring constant or resilience of the piezoelectric diaphragm; a second mass M2 corresponding to a reacted mass of the system; a second spring constant K2 corresponding to the reacted mass spring any load acted upon by the reacted mass; a third mass M3 corresponding to a base of the system; and, a third spring constant K3 corresponding to the system resilient mounting spring.

More particularly, FIG. 8 further illustrates mapping of the model of the general system to structure of the example embodiments already described. In accordance with such mapping, the first mass M1 corresponding to the reaction mass is the mass of reaction mass 34 carried by piezoelectric diaphragm 30. The first spring constant K1 is the spring constant or resilience of piezoelectric diaphragm 30, and affords a first degree of freedom. The second mass M2 corresponds to a reacted mass is the mass of reacted mass cup 40. The second spring constant K2 corresponds to the reacted mass spring and any load upon which the reacted mass acts, and affords a second degree of freedom. Thus, the second spring constant K2 is the spring constant of bellows assembly 50 and any load acted upon by bellows assembly 50, e.g., any load acted upon by piston head 46. The load acted upon by the reacted mass may be, for example, fluid (gas or liquid) being compressed or acted upon by piston head 46. The third mass M3 corresponding to a base of the system is the mass of bellows assembly 58; and, the third spring constant K3 corresponding to the system resilient mounting spring is the spring constant of the resilient means which resiliently mounts the entire foregoing structure relative to the outside world, e.g., either resilient beams 160 (in FIG. 9A) or coiled springs 162 (in FIG. 9B). The third spring constant K3 affords a third degree of freedom. C1, C2, and C3 are damping coefficients, and as shown in FIG. 8 correspond to intrinsic damping (and, the case of C3, work done on the fluid).

The use of the third spring, as represented by third spring constant K3 and implemented, for example, by resilient beams 160 (in FIG. 9A) or coiled springs 162 (in FIG. 9B), thus affords or invokes a third degree of freedom. Unless the motion amplifier or the utilization device in which it is included is firmly clamped to a rigid base (in which case it transmits vibration force, but no energy) or is free (in which case it transmits vibration displacement but also no energy), the vibration will be damped. Therefore, the third spring constant provides a resilient mounting of the motion amplifier 22 within housing 150. An alternative configuration would be to place two well matched units back to back to cancel vibration.

While specific embodiments have been described, the scope hereof is not so limited. For example, the reaction mass can be added or carried elsewhere than on a central underside of the piezoelectric diaphragm. What is preferred is that one of the reaction mass and the reacted mass be at the center of the piezoelectric diaphragm, and the other carried or attached at the periphery of the piezoelectric diaphragm. The reacted mass spring contributes to the spring constant K2 preferably has a first end attached to the reacted mass and a second end attached to a base or housing which serves as the third mass M3. In the particular embodiment that has a third spring, such third spring serves for resiliently mounting the entire system (relative to the rest of the world) and preferably has a first end connected to the amplifier base and a second end connected to a system housing. Alternatively, if there is no such third spring (e.g., no resilient mounting), the amplifier base is rigidly fixed (e.g., to earth) or allowed to float freely.

The springs (having spring constants K1, K2, and K3) and masses M1, M2, and M3 of the system are selected such that the desired operating frequency is at a strategic natural frequency of the system. The reaction mass, the working stroke, and the frequency combine to define the load on the piezoelectric diaphragm. In order to maximize the power transfer from the piezoelectric diaphragm, the load on the piezoelectric diaphragm should lie at half of the blocked force. The blocked force is the force produced by a piezoelectric actuator when "blocked" from moving. In other words, the static force that it can impart on an immovable object. The power transferred is then twenty five percent of the product of blocked force, free displacement, and frequency.

Figure 10:
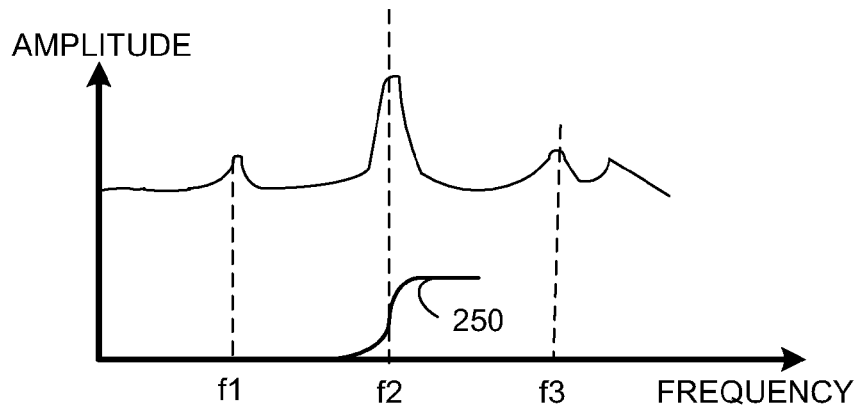
FIG. 10 is a graph showing frequencies of a system which includes a motion amplifier.

In the FIG. 8 depiction, since there are three masses (M1, M2, and M3) and three degrees of freedom, there are also three natural or resonant frequencies f1, f2, and f3. These three resonant frequencies correspond to the three peaks labeled as f1, f2, and f3 in FIG. 10. In FIG. 10, the first peak is frequency f1 which is the resonant frequency of the entire mounting (the natural frequency of everything that is bouncing on K3, e.g., all the structure carried by the resilient beams 160, for example). This first resonant frequency f1 is low and serves to isolate the vibrations of the system from its housing. The third frequency is essentially mass M1 (e.g., reaction mass 34) bouncing on spring K1 (e.g., piezoelectric diaphragm 30). The second resonant frequency is the resonant frequency of the structure carried by spring K2 (e.g., the resonant frequency of the structure carried by the reacted spring mass (the reacted spring mass being reacted mass cup 40 in the illustrated embodiments)). It is this second resonant frequency, f2, which is chosen as the desired operational frequency of the motion amplifier 22. Both first resonant frequency f1 and third resonant frequency f3 are kept reasonably far from the operating frequency f2.

As an aside, in addition to the three resonant frequencies of the system, there are also three partial frequencies $\Omega_1$, $\Omega_2$, and $\Omega_3$, thus making a total of six frequencies. The three partial frequencies are $\Omega_1$=K1/M1, $\Omega_2$=K2/M2, and $\Omega_3$=K3/M3, respectively. Preferably the first partial frequency $\Omega_1$=K1/M1 is made to be a high frequency; the second partial frequency $\Omega_2$=K2/M2 is made equal to about the operating frequency (an intermediate frequency), and the third partial frequency $\Omega_3$=K3/M3 is make to be a fairly low frequency (if operating frequency is about 250 Hz, K3/M3 is made about 40 Hz).

As mentioned above, the motion amplifier 22 is preferably operated at the second resonance frequency (f2). This second resonance frequency is essentially the square root of the quantity K2 divided by the sum of the masses M1 and M2. Because the first spring constant K1 is stiff, mass M1 does essentially the same thing as mass M2 does. So these two masses M1 and M2 bounce on the spring having spring constant K2, and this bouncing is what determines the peak at frequency f2. Advantageously, the displacement amplitude of the motion amplifier increases considerably at the frequency f2, as shown in FIG. 10. For example, operating at the resonant frequency f2 may provide as much as a twenty five fold in displacement amplitude. That is, the amplitude of the displacement of the motion amplifier is twenty five times the amplitude of the displacement of the piezoelectric diaphragm by itself.

Thus, frequency f2 is the operating frequency which produces a greatly amplified motion of the cylinder head (e.g., of flat bottom wall 46 of reacted mass cup 40). Energy is required to drive this large amplitude displacement. There is also a differential motion between mass M1 and mass M2, but such differential motion is not a concern because stresses of the piezoelectric diaphragm are set by the total motion of mass M1 rather than the differential motion.

Of interest also is the phase angle between the motion of the piezoelectric diaphragm and the voltage driving the piezoelectric diaphragm. Line 250 of FIG. 10 shows phase angle as a function of frequency. For a sharply resonant peak like the amplitude peak that occurs for resonant frequency f2, the phase angle goes through a ninety degree phase shift at the resonant frequency and is fairly steep. As FIG. 10 shows, there is almost no phase shift until approaching the resonant frequency f2, and then right after the resonant frequency the phase shift is one hundred eighty degrees.

Figure 11:
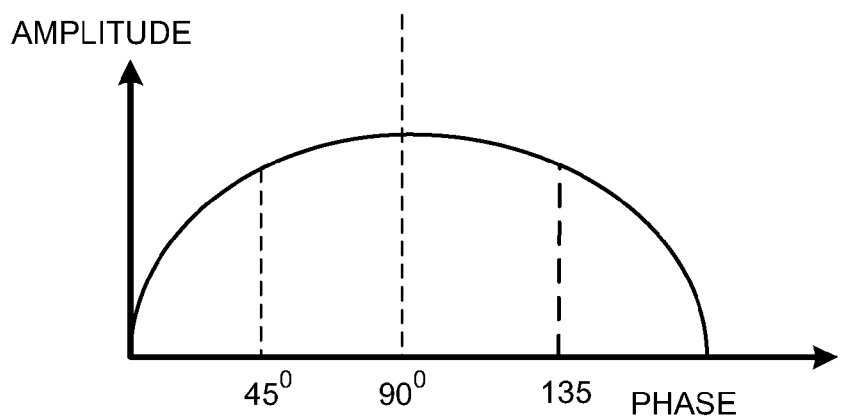
FIG. 11 is a graph showing a plot of amplitude verses phase angle.

FIG. 11 shows a graph of amplitude verses phase angle, which results in a fairly broad curve. The particular curve shown in FIG. 11 is for a particular damping ratio. The lower the damping ratio, the higher the relative response. So operating on the curve of FIG. 11 provides a fairly broad phase angle change for a fairly small change in amplitude. Accordingly, if the phase angle between the displacement of the system and the drive voltage applied to the piezoelectric diaphragm is maintained to, e.g., 10 degrees of the 90 degree resonant frequency f2, the displacement amplitude will be at its peak amplitude almost exactly.

The displacement of the system here is superposition of the displacements X1, X2, and X3 in FIG. 8. Thus, the displacement of the system includes the motion of the piezoelectric diaphragm 30. But since the piezoelectric diaphragm 30 is attached to other masses (actually two masses M1 [reaction mass 34] and M2 [reacted mass 40]) that is moving with the bellows, the displacement of the system is a superposition of the motion of the piezoelectric diaphragm 30 and the other structure attached thereto. Of course, peak amplitude is desired in order to obtain maximum motion amplification, and thus the greatest possible compression ratio when the motion amplifier is used in a compressor assembly.

The sensor and control system 26 thus controls the phase angle between the displacement of the system and the drive voltage applied to the piezoelectric diaphragm 30 to be within a predetermined neighborhood of the second resonant frequency (e.g., within ten degrees of ninety degrees), in order to achieve peak amplitude of displacement of motion amplifier 22. In this regard, sensor and control system 26 employs optical emitter 170 and optical sensor 172 to measure the displacement of the top surface of piezoelectric diaphragm 30. The optical sensor senses displacement of the motion amplifier 22 relative to bellows base 58.

Thus, the sensor and control system 26 measures displacement of piezoelectric diaphragm as well, and thus in actuality measures both displacement of the entire motion amplifier 22 (displacement X1) and the displacement of piezoelectric diaphragm 30 (displacement X2), relative to a fixed position (X3), e.g., on bellows base 58. But as a practical matter, displacement X1 of the piezoelectric diaphragm 30 is fairly small, and displacement X2 is much larger.

Figure 12:
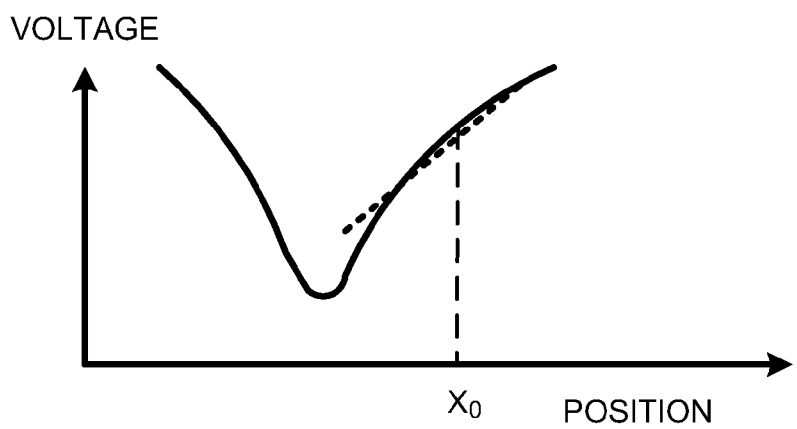
FIG. 12 is a graph showing a plot of a sense position signal (in voltage) as a function of position.

The optical sensor comprising optical emitter 170 and optical sensor 172 measures the displacement by reflection (using a simple type of sensor similar that detects whether door is open or closed). The optical sensor is biased into the linear region. As the distance separating the optical sensor 172 and the piezoelectric diaphragm 30 changes, so does the response as indicated by the sense position signal (see FIG. 6). FIG. 12 is a voltage verses distance graph showing an example response signal (e.g., sense position signal). Operating close to the second resonant frequency, e.g., at point $x_0$, give a high voltage for the sense position signal, but moving away from the second resonant frequency causes the sense position signal voltage to decrease.

The motion amplifier is operated by phase control feedback, as implemented by sensor and control system 26, to lock the system to the second resonant frequency f2 in spite of variations in the load, system non-linearity, and the like. The sensor and control system 26 thus includes a feedback loop to lock the frequency of the drive signal to the piezoelectric diaphragm 30 to produce a fixed value of the phase. The operation of the feedback loop to lock the frequency of the drive signal is understood with reference to control circuit 200 of FIG. 7.

Other aspects of the example control circuit 200 of FIG. 7 will now be described. It should be understood again that the structure and operation of example control circuit 200 of FIG. 7 are merely illustrative, and that other forms of control circuitry (e.g., primarily digital circuitry) may instead be implemented.

The motion of the motion amplifier is sensed by a miniature reflective photointerrupter (e.g., optical sensor 172) of example control circuit 200 of FIG. 7. The photointerrupter is electrically biased to provide a monotonic response with position. The signal from the position detector is buffered by U1B of buffer 208. The series resistance to the optical sensor 172 is set by potentiometer P6 so that, at the nominal position of the piezoelectric diaphragm 30 (about 0.070 inch to the front of the sensor 172), the signal at testpoint 2 is four volts. During operation, the signal is sinusoidal with an amplitude of about two volts peak to peak about the nominal set point of four volts. The buffered signal is ground referenced by C3. The ground referenced peak to peak signal is available at test point 3 as an output. The ground referenced signal is then amplified by the two stage squaring amplifier 210 and 220 comprising U2B and U2A, respectively, until it becomes a square wave.

The optical sensor is phase detected relative to the drive signal. The drive signal is converted to a square wave by amplifying the sine wave used to drive the piezoelectric diaphragm 30 until it saturates the amplifier. The phase angle is detected by the flip flop circuit U4 of phase detector 222. The two square waves are first differentiated by capacitors C5 and C6 to produce spikes which turn the flip flop U4 on and then off with each cycle of the square waves. While the flip flop U4 is on, a voltage is produced at the output Q. The DC level of this voltage is detected by the low pass filter 224 (in U1A). This voltage is proportional to the phase difference between the optical response and the drive voltage.

The phase angle is used to control frequency as follows. The difference between the measured phase angle and a fixed "set point" voltage set by potentiometer P2 is integrated by capacitor C28. The integrator output is inverted by U3A and amplified relative to a frequency set point in U3B. In principle, both inverter 228 and the center frequency setpoint amplifier, U3B and U3A, could be omitted. However, they may be useful because, by shorting capacitor C28, the frequency can be adjusted by potentiometer P8 to sweep over a wide range. The output of U3B drives a voltage variable frequency. This sine wave is offset, buffered, and amplified by U6A, U6B, and U7B. The conditioned sine wave is fed to the high voltage amplifier which drives piezoelectric diaphragm 30. The U8A amplifies the sine wave to produce the square wave needed for the phase detector.

Thus, feedback control is based on the phase angle between the motion of the piezoelectric diaphragm and the drive voltage applied to piezoelectric diaphragm. As explained above, if the phase angle is kept between sixty and one hundred twenty degrees, the motion amplitude will be within 5% of the second resonant frequency peak. Such a relatively broad range in phase space is due to the sharpness of the resonance.

As in the preceding example, the motion sensor may typically detect position. Other types of detection are also possible, such as velocity or acceleration, for example. The currently preferred embodiment is to use an optical sensor comprised of an LED (as optical emitter 170) and phototransistor (as optical sensor 172) where the transconductance depends on position in a relatively linear fashion. Such a sensor provides the additional function of limiting the stroke in order to prevent the drive from impacting the cylinder head.

The example motion amplifier 22 of FIG. 1 includes bellows assembly 50. In the bellows embodiment, the second spring constant K2 corresponds in part to the reacted mass spring and thus includes the spring constant of bellows assembly 50 (as well as the spring constant of any load acted upon by the reacted mass, e.g., the actuator portion of surface).

FIG. 13 illustrates another example embodiment of a motion amplifier, particularly motion amplifier 22'. The motion amplifier 22' includes many of the like-referenced elements of the first embodiment motion amplifier 22 of FIG. 2, including piezoelectric diaphragm 30 which carries reaction mass 34, the piezoelectric diaphragm 30 and reaction mass 34 in turn being carried within reacted mass cup cavity 48 by reacted mass cup 40. In the particular implementation shown in FIG. 13, the bottom of reacted mass cup 40 (e.g., reacted mass cup bottom wall 46) provides or serves as a compression head or piston, e.g., as the actuator portion or surface of the motion amplifier.

The motion amplifier 22' of FIG. 13 differs in the form of the second spring K2 which carries the reacted mass cup 40. In particular, the second spring having spring constant K2 of the FIG. 13 embodiment comprises corrugated diaphragm 270. A rim or periphery of corrugated diaphragm 270 is attached to an amplifier base 58'. Corrugations in the diaphragm 270 enhance motion of the entire motion amplifier structure. Amplifier base 58' at least partially defines a crater-type cavity. The crater-type cavity formed by amplifier base 58' may itself have an undulating surface to accommodate corrugations in the diaphragm 270.

In the particular example shown in FIG. 13, the motion amplifier 22' is utilized in a compressor having a compression chamber 52'. The crater-type cavity partially formed by the amplifier base 58' partially defines the compression chamber 52'. The corrugated diaphragm 270 also at least partially defines the compression chamber 52' by serving as a cover therefore (in addition to serving to support the reacted mass cup 40). An intake or inlet valve 272 is provided in amplifier base 58', as is an outlet or exhaust valve 274.

FIG. 14 shows another embodiment of a motion amplifier, particularly motion amplifier 22(26) which also includes corrugated diaphragm 270. In the FIG. 14 embodiment, the reacted mass 40 has an actuator shaft 49' attached to its actuator surface or region 46. The actuator shaft can selectively reciprocate in the direction shown by arrow A in response to movement of the motion amplifier 22(26). As explained with reference to the FIG. 3 embodiment, the actuator shaft 49' can either abut a contact element or other surface in a utilization device in conjunction with which the motion amplifier works, or serve as a linkage or part of a linkage for such a utilization device.

For both the embodiment of FIG. 13 and the embodiment of FIG. 14, the corrugated diaphragm 270 can be provided in the form of an essentially solid member upon which the reacted mass cup 40 is situated. In this implementation, the corrugated diaphragm 270 can have reacted mass cup 40 adhered or otherwise secured thereover.

Alternatively, the corrugated diaphragm 270 can have a central aperture or the like through which the bottom (e.g., the compression head) of reacted mass cup 40 protrudes. The reacted mass cup 40 is, in this implementation, securely engaged by corrugated diaphragm 270 in its central aperture.

The corrugated diaphragm 270 may be fabricated from a flexible material such as elastomer, or of a rigid material such as nickel, silver, or steel. In the size ranges of commercial interest, a flat rigid diaphragm would have a very non-linear deflection curve which might create a challenge for maintaining resonant operation. Therefore, a corrugated diaphragm is recommended. The end wall of the amplifier base 58' may be contoured to provide minimum dead volume.

For the FIG. 14 embodiment, the actuator shaft or other comparable element may be secured to the actuator surface or region 46 by any suitable means, such as by an adhesive, or fastener, or integrally formed therewith, for example.

Other embodiments and ways of employing a motion amplifier are also possible. For example, a motion amplifier can reciprocate in a base, with sliding seals provided between the motion amplifier and the base. Alternatively, a rubber-edged disk or bellofram may be utilized. As another alternative, a Peek diaphragm or electroformed bellows may be employed.

Whatever embodiment the motion amplifier 22 takes, including the embodiments of FIG. 13 and FIG. 14 described above and the embodiment of FIG. 15 described hereinafter, providing a third degree of freedom eliminates or mitigates any dampening imposed or caused by the outside world. To this end, coiled springs 162 are shown in FIG. 13 and FIG. 14 as providing the spring constant K3 and thus the third degree of freedom. Other resilient mounting structure or techniques can be employed, such as (by way of non-limiting example) the resilient beams hereinbefore described.

As mentioned above, the drive signal can be applied to motion initiator element 30 by radially extending electrodes or leads 32. Flexures can be arranged in these leads or electrodes to pass electricity to the motion initiator element 30 since the motion initiator element 30 moves with respect to the housing in which the power supply may be fixed. Moreover attachment points of the flexing leads, one being on the motion initiator element 30 and the other being fixed in space, may lie directly over each other as to form a hairpin shape, which is efficient with respect to bending stresses on the attachment points.

Figure 15:
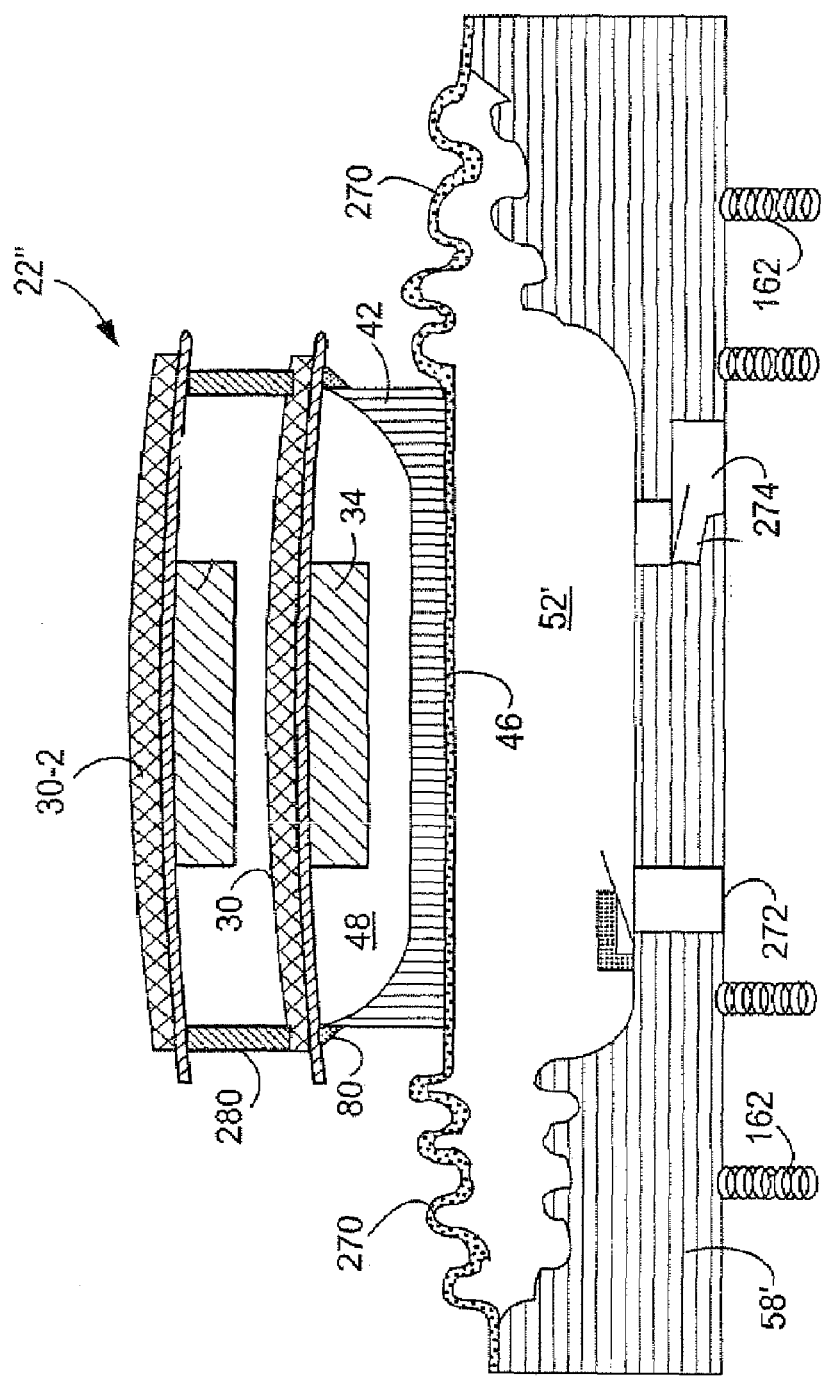
FIG. 15 is a schematic sectioned view of portions of a motion amplifier according to yet another example embodiment, and particularly comprising plural motion initiator elements.

FIG. 15 illustrates another embodiment of a motion amplifier 22" wherein the motion amplifier comprises plural motion initiator elements, e.g., plural piezoelectric diaphragms 30. In the illustrated example of FIG. 15, a second piezoelectric diaphragm 30-2 is positioned by mounting member 180 above the first piezoelectric diaphragm 30. The mounting member 180 can take the form of pedestals or a ring. More than one auxiliary piezoelectric diaphragm 30 can be provided, e.g., in stacking arrangement, in similar manner, not only for the illustrated embodiment having a corrugated diaphragm, but for the bellows embodiment and other embodiments as well.

In a preferred embodiment and mode of operation, piezoelectric diaphragm 30 more particularly takes the form of a ruggedized laminated piezoelectric member. Examples of such ruggedized laminated piezoelectric members are provided in PCT Patent Application PCT/US01/28947, filed 14 Sep. 2001; U.S. patent application Ser. No. 10/380,547, filed Mar. 17, 2003, entitled "Piezoelectric Actuator and Pump Using Same"; U.S. patent application Ser. No. 10/380,589, filed Mar. 17, 2003, entitled "Piezoelectric Actuator and Pump Using Same", and U.S. patent application Ser. No. 11/279,647 filed Apr. 13, 2006, entitled "PIEZOELECTRIC DIAPHRAGM ASSEMBLY WITH CONDUCTORS ON FLEXIBLE FILM", all of which are incorporated herein by reference.

The motion amplifier 22 uses the displacement/motion of piezoelectric diaphragm 30 (such displacement being on the order of 0.1 mm for an example embodiment) to drive an actuator region or surface (e.g., compressor head) to large displacements. In illustrated embodiment, the actuator surface (also known as a cylinder head or piston head) may take the form of flat bottom wall 46 of reacted mass cup 40.

For example, a displacement of 2 mm (e.g., strokes of 2 mm) is possible in motion amplifier 22 having a 25 mm piezoelectric diaphragm 30 operating at 400 volts peak to peak. Such a drive voltage would only produce a 0.16 mm stroke if applied directly to the piezoelectric diaphragm 30 alone. Since the motion of the piezoelectric diaphragm 30 in the motion amplifier 22 is at most half of this 0.16, or only 0.08 mm, a "gain" of 25 is achieved. This gain occurs at the operating frequency which is a resonant condition. This resonant condition (frequency and gain) change with load and system nonlinearities, such as a hardening spring (typical of diaphragms and gas springs).

In addition to large amplitude, an advantage of the motion amplifiers described herein are their ability to impedance match to a variable load. When the motion amplifier is used in compressor assembly 20 or 20', for example, the load impedance changes as the flow rate and pressure rise of the compressor change. Over wide ranges the piezoelectric diaphragm can still drive the load efficiently because of the flexibility afforded by the resonant drive of the sensor and control system. Thus, at low flow rates, pressures up to the limit imposed by the maximum achievable compression can be reached. Work is not expended until the valves open to allow fluid to escape the compression chamber. With no flow (and also with no pressure rise), no energy is lost from the system. At low pressures, the flow is only limited by the maximum possible displacement. Intermediate operating points tend to fall on a hyperbolic operating curve representing constant input power. By way of contrast, centrifugal and axial compressors have very little tolerance to changes in load.

Although the description above contains many specificities, these should not be construed as limiting the scope of the invention but as merely providing illustrations of some of the presently preferred embodiments of this invention. Thus the scope of this invention should be determined by the appended claims and their legal equivalents. Therefore, it will be appreciated that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more." All structural, chemical, and functional equivalents to the elements of the above-described preferred embodiment that are known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims. No claim element herein is to be construed under the provisions of 35 U.S.C. 112, sixth paragraph, unless the element is expressly recited using the phrase "means for."

What is claimed is:

1. A motion amplifier comprising:
   a piezoelectric diaphragm;
   a reaction mass connected to the piezoelectric diaphragm;
   a reacted mass connected to the piezoelectric diaphragm;
   a reacted mass spring for resiliently carrying the reacted mass;
   wherein a periphery of the piezoelectric diaphragm is held and carried by the reacted mass;
   wherein the reacted mass comprises a reacted mass cup which defines a reacted mass cavity, and wherein the reaction mass is suspended from the piezoelectric diaphragm in the reacted mass cavity.

2. The apparatus of claim 1, further comprising drive electronics for driving the piezoelectric diaphragm by generating and applying a drive signal to the piezoelectric diaphragm.

3. The apparatus of claim 2, wherein the drive electronics generates and applies a drive signal to the piezoelectric diaphragm to maintain the motion amplifier resonant at a predetermined frequency.

4. The apparatus of claim 3, wherein structure of the motion amplifier carried by the reacted mass spring has a resonant frequency f2, wherein the predetermined frequency is f2, and wherein the drive signal is generated to urge the motion amplifier to the frequency f2 as its operational frequency, thereby achieving peak amplitude displacement of the motion amplifier.

5. The apparatus of claim 4, wherein the resonant frequency f2 is related to a spring constant K2 of the reacted mass spring and a sum of masses of the reaction mass and the reacted mass.

6. The apparatus of claim 2, wherein the drive electronics generates the drive signal to maintain a predetermined phase angle between the drive signal and a signal indicative of displacement of the motion amplifier.

7. The apparatus of claim 6, wherein the drive electronics comprises a sensor for sensing displacement of the motion amplifier and for generating the signal indicative of displacement of the motion amplifier.

8. The apparatus of claim 1, further comprising:
   an amplifier base; and
   means for resiliently mounting the amplifier base relative to the outside world.

9. The apparatus of claim 8, wherein the amplifier base carries the piezoelectric diaphragm, the reaction mass, the reacted mass, and the reacted mass spring.

10. The apparatus of claim 9, wherein the reacted mass spring comprises a corrugated diaphragm.

11. The apparatus of claim 1, further comprising a bellows assembly, and wherein the bellows assembly comprises a sidewall for at least partially comprising the reacted mass spring.

12. The apparatus of claim 11, wherein the bellows assembly further comprises an amplifier base, and further comprising means for resiliently mounting the amplifier base relative to the outside world.

13. A motion amplifier comprising:
   a piezoelectric diaphragm;
   a reaction mass connected to the piezoelectric diaphragm;
   a reacted mass connected to the piezoelectric diaphragm;
   a reacted mass spring for resiliently carrying the reacted mass;
   wherein the reacted mass spring comprises a corrugated diaphragm;
   wherein the reacted mass comprises a reacted mass cup which defines a reacted mass cavity, and wherein the reaction mass is suspended from the piezoelectric diaphragm in the reacted mass cavity.

14. The apparatus of claim 13, wherein the corrugated diaphragm has corrugations proximate a circumference of the diaphragm.

15. The apparatus of claim 13, wherein a periphery of the piezoelectric diaphragm is held and carried by the reacted mass.

16. The apparatus of claim 13, further comprising drive electronics for driving the piezoelectric diaphragm by generating and applying a drive signal to the piezoelectric diaphragm.

17. The apparatus of claim 16, wherein the drive electronics generates and applies a drive signal to the piezoelectric diaphragm to maintain the motion amplifier resonant at a predetermined frequency.

18. The apparatus of claim 17, wherein structure of the motion amplifier carried by the reacted mass spring has a resonant frequency f2, wherein the predetermined frequency is f2, and wherein the drive signal is generated to urge the motion amplifier to the frequency f2 as its operational frequency, thereby achieving peak amplitude displacement of the motion amplifier.

19. The apparatus of claim 18, wherein the resonant frequency f2 is related to a spring constant K2 of the reacted mass spring and a sum of masses of the reaction mass and the reacted mass.

20. The apparatus of claim 16, wherein the drive electronics generates the drive signal to maintain a predetermined phase angle between the drive signal and a signal indicative of displacement of the motion amplifier.

21. The apparatus of claim 20, wherein the drive electronics comprises a sensor for sensing displacement of the motion amplifier and for generating the signal indicative of displacement of the motion amplifier.

22. The apparatus of claim 13, further comprising:
an amplifier base to which the reacted mass spring is attached; and
means for resiliently mounting the amplifier base relative to the outside world.

23. The apparatus of claim 22, wherein the amplifier base carries the piezoelectric diaphragm, the reaction mass, the reacted mass, and the reacted mass spring.

24. A motion amplifier comprising:
a piezoelectric diaphragm;
a reaction mass connected to the piezoelectric diaphragm;
a reacted mass connected to the piezoelectric diaphragm;
a reacted mass spring for resiliently carrying the reacted mass;
a bellows assembly, and wherein the bellows assembly comprises a sidewall for at least partially comprising the reacted mass spring;
wherein the reacted mass comprises a reacted mass cup which defines a reacted mass cavity, and wherein the reaction mass is suspended from the piezoelectric diaphragm in the reacted mass cavity.

25. The apparatus of claim 24, wherein a periphery of the piezoelectric diaphragm is held and carried by the reacted mass.

26. The apparatus of claim 24, further comprising drive electronics for driving the piezoelectric diaphragm by generating and applying a drive signal to the piezoelectric diaphragm.

27. The apparatus of claim 26, wherein the drive electronics generates and applies a drive signal to the piezoelectric diaphragm to maintain the motion amplifier resonant at a predetermined frequency.

28. The apparatus of claim 27, wherein structure of the motion amplifier carried by the reacted mass spring has a resonant frequency f2, wherein the predetermined frequency is f2, and wherein the drive signal is generated to urge the motion amplifier to the frequency f2 as its operational frequency, thereby achieving peak amplitude displacement of the motion amplifier.

29. The apparatus of claim 28, wherein the resonant frequency f2 is related to a spring constant K2 of the reacted mass spring and a sum of masses of the reaction mass and the reacted mass.

30. The apparatus of claim 27, wherein the drive electronics generates the drive signal to maintain a predetermined phase angle between the drive signal and a signal indicative of displacement of the motion amplifier.

31. The apparatus of claim 30, wherein the drive electronics comprises a sensor for sensing displacement of the motion amplifier and for generating the signal indicative of displacement of the motion amplifier.

32. The apparatus of claim 24, further comprising:
an amplifier base connected to the reacted mass spring; and
means for resiliently mounting the amplifier base relative to the outside world.

33. The apparatus of claim 32, wherein the amplifier base carries the piezoelectric diaphragm, the reaction mass, the reacted mass, and the reacted mass spring.

34. A motion amplifier comprising:
a piezoelectric diaphragm;
a reaction mass connected to the piezoelectric diaphragm;
a reacted mass connected to the piezoelectric diaphragm;
a reacted mass spring for resiliently carrying the reacted mass;
an amplifier base connected to at least one of the reacted mass and the reacted mass spring;
means for resiliently mounting the amplifier base relative to the outside world;
wherein the reacted mass comprises a reacted mass cup which defines a reacted mass cavity, and wherein the reaction mass is suspended from the piezoelectric diaphragm in the reacted mass cavity.

35. The apparatus of claim 34, wherein a periphery of the piezoelectric diaphragm is held and carried by the reacted mass.

36. The apparatus of claim 34, further comprising drive electronics for driving the piezoelectric diaphragm by generating and applying a drive signal to the piezoelectric diaphragm.

37. The apparatus of claim 36, wherein the drive electronics generates and applies a drive signal to the piezoelectric diaphragm to maintain the motion amplifier resonant at a predetermined frequency.

38. The apparatus of claim 37, wherein structure of the motion amplifier carried by the reacted mass spring has a resonant frequency f2, wherein the predetermined frequency is f2, and wherein the drive signal is generated to urge the motion amplifier to the frequency f2 as its operational frequency, thereby achieving peak amplitude displacement of the motion amplifier.

39. The apparatus of claim 38, wherein the resonant frequency f2 is related to a spring constant K2 of the reacted mass spring and a sum of masses of the reaction mass and the reacted mass.

40. The apparatus of claim 36, wherein the drive electronics generates the drive signal to maintain a predetermined phase angle between the drive signal and a signal indicative of displacement of the motion amplifier.

41. The apparatus of claim 40, wherein the drive electronics comprises a sensor for sensing displacement of the motion amplifier and for generating the signal indicative of displacement of the motion amplifier.

42. The apparatus of claim 34, wherein the amplifier base carries the piezoelectric diaphragm, the reaction mass, the reacted mass, and the reacted mass spring.

43. The apparatus of claim 34, wherein the reacted mass spring comprises a corrugated diaphragm.

44. The apparatus of claim 34, further comprising a bellows assembly, and wherein the bellows assembly comprises a sidewall for at least partially comprising the reacted mass spring.

\* \* \* \* \*